US007512229B2

(12) United States Patent
Kaneko

(10) Patent No.: US 7,512,229 B2
(45) Date of Patent: Mar. 31, 2009

(54) KEY UNIT, METHOD FOR MARKING KEY TOP, AND METHOD FOR MANUFACTURING KEY UNIT USING THE SAME

(75) Inventor: Takehiro Kaneko, Souwa-machi (JP)

(73) Assignee: Sunarrow Ltd, Tokyo (JP)

( * ) Notice: Subject to any disclaimer, the term of this patent is extended or adjusted under 35 U.S.C. 154(b) by 761 days.

(21) Appl. No.: 10/524,161

(22) PCT Filed: Oct. 21, 2003

(86) PCT No.: PCT/JP03/13438

§ 371 (c)(1),
(2), (4) Date: Feb. 8, 2005

(87) PCT Pub. No.: WO2004/038746

PCT Pub. Date: May 6, 2004

(65) Prior Publication Data

US 2008/0013713 A1 Jan. 17, 2008

(30) Foreign Application Priority Data

Oct. 23, 2002 (JP) ............................. 2002-307914
Jan. 30, 2003 (JP) ............................. 2003-021271

(51) Int. Cl.
*H04M 1/00* (2006.01)
*H04M 9/00* (2006.01)
*B23K 26/00* (2006.01)
*G03F 1/00* (2006.01)
*G03F 7/00* (2006.01)

(52) U.S. Cl. ............................ 379/433.07; 219/121.69; 430/320

(58) Field of Classification Search ............ 379/433.01, 379/433.06, 433.07; 219/121.69; 430/320, 430/945
See application file for complete search history.

(56) References Cited

U.S. PATENT DOCUMENTS 6,187,514 B1 * 2/2001 Kiyosawa et al. ........... 430/320

FOREIGN PATENT DOCUMENTS

JP 4-37487 2/1992
JP 5-282956 10/1993

(Continued)

OTHER PUBLICATIONS

Translation of International Preliminary Examination Report.

(Continued)

*Primary Examiner*—Curtis Kuntz
*Assistant Examiner*—Tuan D Nguyen
(74) *Attorney, Agent, or Firm*—James V. Costigan; Hedman & Costigan, P.C.

(57) ABSTRACT

As a marking laser beam, a laser beam of wavelength 532 nm obtained by extracting by extracting second higher harmonic of the Nd:YAG laser or a laser beam of wavelength 355 nm obtained by extracting third higher harmonic of the Nd:YAG laser is used on a metal film formed on a plastic key top of a mobile telephone or the like, so that the metal film portion subjected to the beam is completely removed or only the surface portion of the metal film subjected to the beam is removed, thereby forming a planar set of very small concave points. Thus, it is possible to obtain a key unit having a metal film on which a character or symbol is directly marked.

5 Claims, 8 Drawing Sheets

FOREIGN PATENT DOCUMENTS

| | | |
|---|---|---|
| JP | 7-288054 | 10/1995 |
| JP | 11-27362 | 1/1999 |
| JP | 11-66997 | 3/1999 |
| JP | 11-167835 | 6/1999 |
| JP | 2000-075439 | 3/2000 |
| JP | 2001-053356 | 2/2001 |
| JP | 2001-073154 | 3/2001 |
| JP | 2001-283430 | 10/2001 |
| JP | 2002-117741 | 4/2002 |
| JP | 2002-270059 | 9/2002 |

OTHER PUBLICATIONS

Translation of International Preliminary Examination Report dated Oct. 6, 2005.

* cited by examiner

CONSTITUTION OF HARMONICS OSCILLATING SOLID LASER USING NON-LINEAR CRYSTAL
(OUTPUT OF GREEN 0.53 μm)

KEY UNIT, METHOD FOR MARKING KEY TOP, AND METHOD FOR MANUFACTURING KEY UNIT USING THE SAME

TECHNICAL FIELD

The present invention relates to a key unit provided with a key top having a metallic film on a surface of the key unit for a mobile device such as a portable telephone or a portable digital assistant (PDA), a marking method to a key top for forming a predetermined pattern such as a character or a symbol on the key top having the metallic film, and a manufacturing method of a key unit by utilization of the marking method.

BACKGROUND ART

A key unit is one kind of part constituting a mobile device such as a portable telephone in which a large number of switch operation keys (push buttons) are aggregated and arranged on one sheet face. One key is made up of a key top made of a hard resin or the like attached to a surface of a key pad made of a soft material such as a silicone rubber or a thermoplastic elastomer; and the key pad having a switch pressing projection (so-called "pressing member") on its back face. The keys are interconnected by the key pad. By disposing a circuit board provided with switch elements on the lower face of the key unit constituted as described above, a key switch is formed at a position corresponding to each key. An illumination type key unit as one kind of key unit as described above has a construction in which the character, the symbol, or the like, of each key is irradiated by a light from a light source.

Because the key top is disposed at a position to be most conspicuous in the objective mobile device, a special attention is paid to its design and ornamentation. A key top in which a metallic film is formed on the whole surface of the key top or the bottom face, which is a face facing the key pad, and the top face, by plating or the like, (hereinafter referred to as "metallic key") is welcome because it has both of durability and high-grade feeling.

Normally, on a surface of the metallic key, a character, a symbol, or the like, indicating the function of the key is formed. As a method for forming the character, the symbol, or the like, on the metallic key, marking processing by a laser is thinkable. However, in forming the character, the symbol, or the like, directly on the metallic key in which a metallic film having a thickness of 0.1 to 30 μm and high surface reflectance has been formed by plating or the like on its key top made of plastic, by laser marking, which completely removes the metallic film at the irradiated portion, there is a difficult point in comparison with simply marking or cutting a metallic plate or the like by laser.

For example, if a character, a symbol, or the like, is tried to be formed directly on a key top in which mirror plating with chromium or the like has been applied to a surface of a key made of plastic, using a near infrared light of a wavelength of 1064 nm as the fundamental wave of Nd:YAG (an yttrium aluminum garnet crystal doped with neodymium ions), which is a solid laser used widely, there is a problem in which the temperature of the portion other than the irradiated point rises before the objective character or the like is formed, and sufficient processing can not be performed because the underlayer plastic is melted or the like. It is thinkable that this is because the energy density at the irradiated point is insufficient because the spot diameter is difficult to be throttled by a lens optical system because the near infrared light is relatively long in wavelength.

Because of such a difficulty of laser marking to a metallic key, for manufacturing a partially plated key in which a character, a symbol, or the like, as an unplated portion, is mixed on a plated surface, the following complicated process was hitherto performed (for example, JP-A-2001-73154). That is, according to JP-A-2001-73154, a processing procedure is performed as "molding a plastic key top→surface roughness/activation→electroless plating with copper→electroless plating with tin on copper→laser marking processing on a tin plating layer (exposure of a copper plating layer)→removing the copper plating layer at a character portion by etching→electroless plating with nickel (other than the character portion)→electro plating with gold on nickel".

In addition, there is a marking method called "Shibo process". This is a method in which a plane aggregation of a large number of very small recessed points (recesses having its diameter and depth of 10 to 30 μm) is formed on the metallic film on the metallic key surface. For representing the shape of a character or the like by this Shibo process, conventionally, an electroformed mold is used in general. The electroformed mold is used by being incorporated in a mold for key top molding, and has a portion on which the plane aggregation of very small recessed points for forming a character or the like on the key top surface has been reversely transferred.

An example of an electroformed mold making process is as follows. First, a matrix for a key top having a non-marked surface is prepared with a synthetic resin, a copper alloy, or the like, and a desired pattern such as a character or a symbol is formed on the matrix by adequate surface roughness means. And, a film of a mold release agent is adhered to the matrix, and further, electro conductivity is given by applying silver mirror processing in case of the matrix of a synthetic resin, and then metallic plating is applied till the thickness reaches several millimeters. This plating process requires several tens days, and this process is called "electroforming". After completion of electroforming, by peeling the portion formed by plating off the matrix, an electroformed mold can be obtained. And, a resin capable of plating, such as ABS (acrylonitrile-butadiene-styrene copolymer), is injected into a mold for molding a key top, in which the electroformed mold is incorporated, to form a key top. Next, by forming a metallic film on a surface of the key top by plating, a metallic key on which a pattern such as a character or a symbol has been formed by a Shibo process can be obtained. However, the electroformed mold has a defect that it can not rapidly cope with a change in pattern such as a character or a symbol.

Thus, like the case wherein a character, a symbol, or the like, is directly formed by laser marking, which completely removes the metallic film at the irradiated portion, it is thinkable that part of the metallic film, that is, only a surface layer portion of the metallic film, is removed by laser marking and a plane aggregation of a large number of very small recessed points is formed to perform a Shibo process. Actually, marking a character or the like by a Shibo process by laser on a iron plate or an aluminum plate. However, when the film thickness of metal is too thin, it is impossible to apply a Shibo process. In addition, even in case that the film thickness is relatively thick, there were many difficult problems in comparison with a case of performing to a simple metallic plate.

DISCLOSURE OF THE INVENTION

Problem to be Solved by the Invention

The problem that the present invention is to solve is to provide a method of marking a predetermined pattern such as a character or a symbol directly in a simple process on a metallic film by irradiating, with a laser light, the metallic film applied on a surface of a key top made of a synthetic resin used in a mobile device such as a portable telephone, and removing completely the metallic film at the irradiated portion or only a surface layer portion of the metallic film at the irradiated portion to form a plane aggregation of a large number of very small recessed points.

Means for Solving the Problem

The above problem is solved by using, as a laser light, a YAG laser having a wavelength of 1064 nm and a convergence diameter of 30 μm or less to the irradiated portion, a YAG laser having a wavelength of 532 nm obtained by taking out the second harmonics, or an excimer laser having a wavelength of 180 nm and a convergence diameter at molecular level to the irradiated portion.

In the above means, a principal reason for adopting the above laser light is as follows. First, in case of the same amplitude, the energy of a laser light relatively increases as the wavelength is shortened. Secondly, as shown in the graph of FIG. 8 (quoted from Yu Kanaoka "Laser Processing", May, 1995/THE NIKKAN KOGYO SHIMBUN, LTD.), although the reflectance on a plated surface is near one on the long wavelength side, it decreases (the absorptance increases) on the short wavelength side with respect to the border near 500 nm. Thirdly, differently from infrared to near infrared rays, in case of from visual light to near ultraviolet light, a spot diameter of 10 to 30 μm can easily be obtained by lens condensation. Fourthly, in case of an excimer laser, a spot diameter at molecular level can be obtained.

Upon laser marking, the beam spot (focus) is moved in plane to scan a character, a symbol, or the like, to be drawn. On the other hand, when the metallic film is completely removed, it is moved also in a depth direction of the metallic film. During that, the spot diameter is controlled into about 30 μm at the maximum. In addition, as for movement of the beam spot in the depth direction, the movement must be controlled to be within the range of the thickness of the metallic film in order that the laser light attacks directly the underlayer plastic layer. Such control can be precisely performed by using a laser irradiation apparatus in which the optical system for forming the beam spot is strictly controlled by a computer.

The wavelength of the laser light used in the above laser irradiation apparatus is preferably shorter from the viewpoint that the energy of the laser light increases as the wavelength is shortened. However, the energy density can be improved also by decreasing the spot diameter.

On the other hand, from the viewpoint of using the fact that the light absorptance on a metallic plated surface increases on the short wavelength side with respect to the border near about 500 nm, a visual light or near ultraviolet light of 550 nm or less suffices.

By using the laser light of the wavelength that satisfies the above conditions, while the temperature of the portion other than the irradiated point is kept the permissible temperature or less, the metallic film can be rapidly removed or only a surface portion of the metallic film at the irradiated portion can be rapidly removed to form a plane aggregation of a large number of very small recessed points and mark a predetermined pattern such as a character or a symbol. In this case, the laser irradiation type may be any of a continuous type and a pulse type as far as the necessary optical power is supplied.

DESCRIPTION OF REFERENCE NUMERALS

Figure 1:
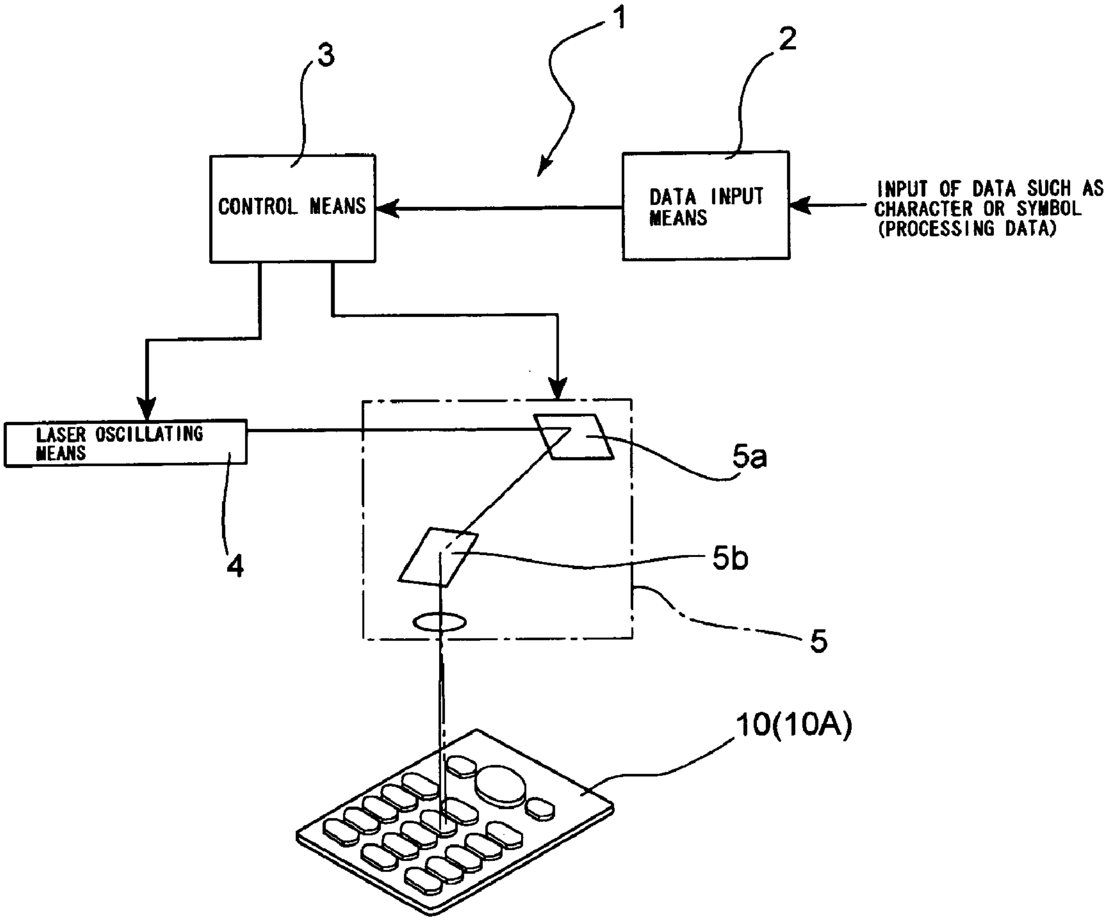
FIG. 1 is a view generally showing a constitution of a laser irradiation apparatus used in the present invention.

1: laser oscillating means
2: data input means
3: control means
4: laser oscillating means
5: optical system
5*a*, 5*b*: mirror
5*c*: lens
10: key unit
10A: key unit
11: key pad
11*a*: pressing projection
12: key top
12*a*: top face
12*b*: side face
12*c*: bottom face
13: pattern such as character or symbol
14: main body
15: metallic film
16: laser light
17: colored layer
18: transparent adhesive
19: dome switch
20: substrate
21: pattern such as character or symbol Effect of the Invention According to the invention according to claim 1, because the character, the symbol, or the like, is marked by a Shibo process by a laser light on the metallic film on the key top surface formed by plating, the key unit rich in ornamentation and having superior wear resistance in which the pattern is never peeled off and vanished due to wear or the like, can be obtained.

According to the invention according to claim 2, because the absorptance of the optical energy at the irradiated point can be increased and the beam spot diameter can be throttled when marking is performed on the key top, the energy absorption density at the irradiated point is improved and marking can be rapidly performed on the metallic plating layer while the temperature of the portion other than the irradiated point is kept the permissible temperature or less, and thus the key unit free from thermal deformation and rich in ornamentation, can be obtained.

According to the invention according to claim 3, because the absorptance of the optical energy at the irradiated point can be increased and the beam spot diameter can be throttled when laser marking of the character, the symbol, or the like, is performed on the key top in which the metallic film is formed by plating on the surface of the key top made of plastic used in the mobile device such as a portable telephone, the energy absorption density at the irradiated point is improved and only the surface portion of the metallic film at the irradiated portion can be rapidly removed to perform marking in which the plane aggregation of a large number of very small recessed points, while the temperature of the portion other than the irradiated point is kept the permissible temperature or less.

According to the invention according to claim 4, because the absorptance of the optical energy at the irradiated point can be increased and the beam spot diameter can be throttled when marking is performed on the key top, the energy absorption density at the irradiated point is improved and marking is rapidly performed on the metallic plating layer while the temperature of the portion other than the irradiated point is kept the permissible temperature or less.

According to the invention according to claim 5, because all steps that can be performed in a state wherein the destination is undetermined are completed and marking by the laser light to the key top face is performed to complete all steps as soon as the portion of characters/symbols in relation to the destination is decided, the key unit can be completed in the shortest time after the destination is determined and a wasteful stock caused by market production can be eliminated.

BEST MODE FOR CARRYING OUT THE INVENTION

Hereinafter, an embodiment of the present invention will be described with reference to the accompanying drawings.

Figure 2:
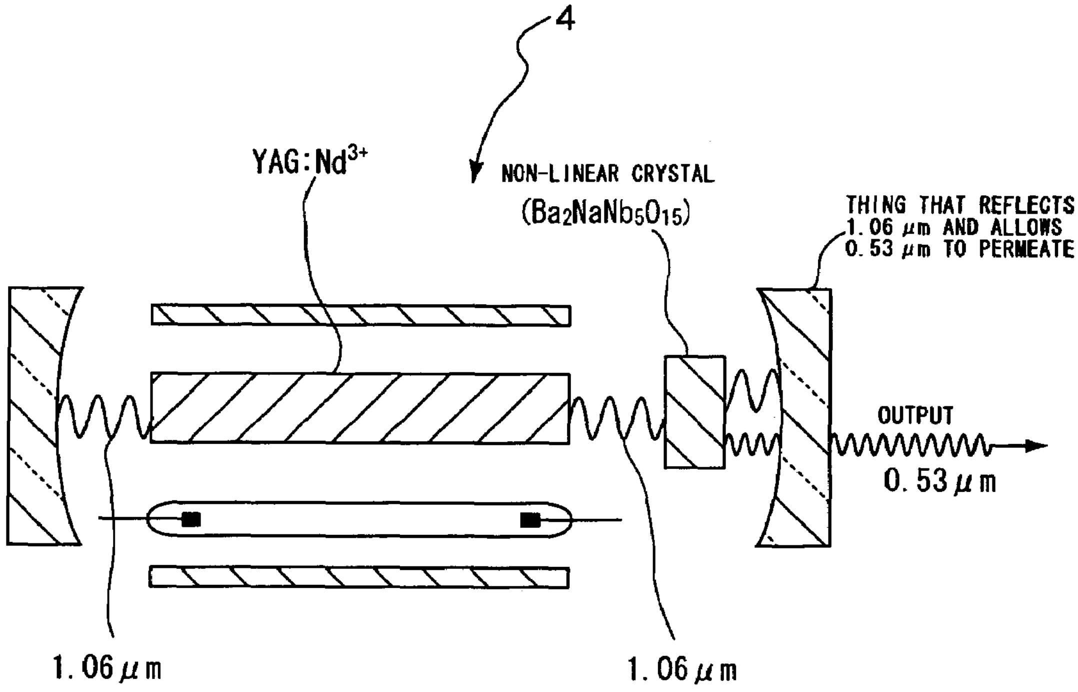
FIG. 2 is a conceptional view for explaining a construction of a second harmonics YAG laser.

First, a laser irradiation apparatus will be described. FIGS. 1 and 2 are conceptional views for explaining a constitution of the laser irradiation apparatus 1 used in the present invention. The laser irradiation apparatus 1 is made up of data input means 2, control means 3, laser oscillating means 4, an optical system 5 including a plurality of mirrors and a lens, and so on.

The data input means 2 performs input of data concerning a pattern such as a character or a symbol (solid data), and storage of input data. The input data is input, for example, in a form of CAD data prepared by a computer. The control means 3 controls operations of the laser oscillating means 4 and the optical system 5 by data input through the above data input means 2 to generate processing data for use in actual process.

The laser oscillating means 4 oscillates a light of a wavelength of 532 nm as a laser light, which is obtained by half-wavelength conversion of the fundamental wave of a wavelength of 1064 nm of an Nd:YAG laser. This half-wavelength conversion is realized by taking out the second harmonics of the Nd:YAG laser. The laser thus constituted is called "second harmonics YAG laser". The laser light of a wavelength of 532 nm is also called "green laser" because it exhibits green color. FIG. 2 is a conceptional view showing an example of a constitution of the laser oscillating means 4 in the second harmonics YAG laser (quoted from Haruhiro Kobayashi "Lecture of Laser", January, 1992/THE NIKKAN KOGYO SHIMBUN, LTD.).

On the other hand, as the above laser light, a near ultraviolet light of a wavelength of 355 nm obtained by taking out the third harmonics of the Nd:YAG laser can be also used. This Nd:YAG laser taking out the third harmonics is called "third harmonics YAG laser". The constitution of the laser oscillating means 4 in this case is also fundamentally substantially the same as that shown in FIG. 2.

Further, as the above laser light, one of the second to fourth harmonics of a solid laser, such as a glass laser doped with Nd (neodymium) ions or a $YVO_4$ laser, can be also used.

As shown in FIG. 1, the optical system 5 is made up of two mirrors (galvano scanners) 5*a* and 5*b* rotating in different directions from each other for controlling the irradiation direction of the laser light; a lens (F0 lens) 5*c* for converging the laser light; and so on.

The laser irradiation apparatus 1 having the constitution as described above controls operations of the optical system and so on by processing data generated on the basis of input data, controls the three-dimensional position (positions of the respective axes of XYZ) of a beam spot of the laser light and timings of ON/OFF of laser light irradiation with making a relation to each other, and fully automatically performs marking a character, a symbol, or the like, on a metallic film 15 on a top face 12*a* of a key top 12.

Therefore, by this laser irradiation apparatus 1, the top face of each key top of a key unit as will be described later is irradiated with a laser light. The beam spot (focus) is moved in plane to scan a character, a symbol, or the like, to be drawn. In case that the metallic film is completely removed, the beam spot is moved also in a depth direction of the metallic film. Thereby, the metallic film at the irradiated portion is completely removed or only a surface layer portion of the metallic film at the irradiated portion is removed, and processing for forming a plane aggregation of a large number of very small recessed points (hereinafter simply referred to as "Shibo process") is performed to mark a pattern such as a character or a symbol.

Next, a structure of a first example 10 of a key unit in which a pattern such as a character or a symbol is marked using the above laser irradiation apparatus 1 will be described.

Although an example is shown in which any key top has a metallic film and marking by a laser light is performed to the metallic film in the first example 10 of the key unit and a second example 10A of a key unit as will be described later, the present invention is not limited to this. A key top having at least one or more metallic films and in which marking by a laser light is performed to those may be used. In addition, for unifying the marking method for characters, symbols, and the like, in the key unit, as a key top having no metallic film, a key top is desirably used that has a layer by printing or painting laminated on a surface, and in which marking of a character, a symbol, or the like, is performed to the layer by printing or painting, using a laser light.

Figure 3:
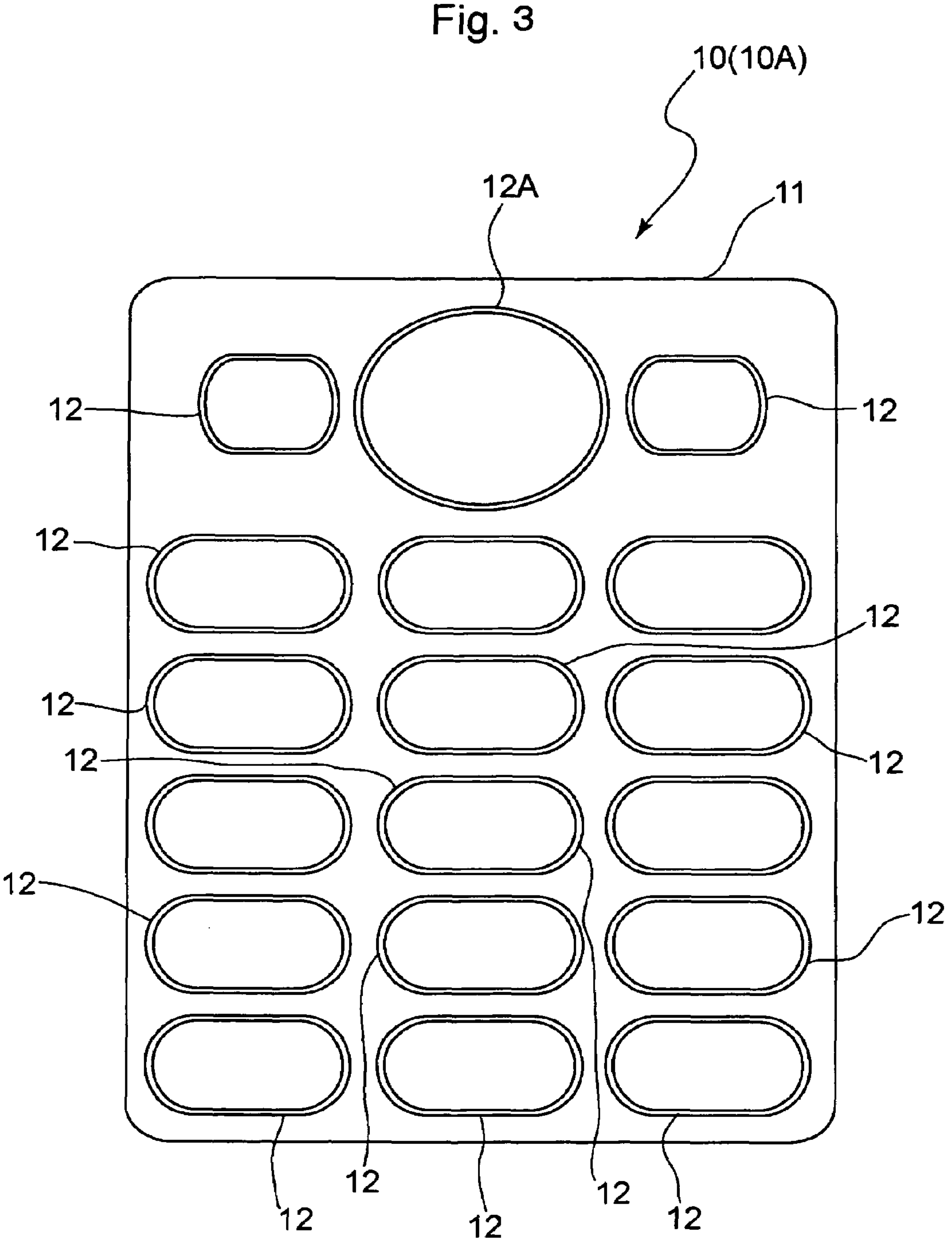
FIG. 3 is a plan view showing a key unit (before marking characters, a symbols, and so on) in the present invention.
Figure 4:
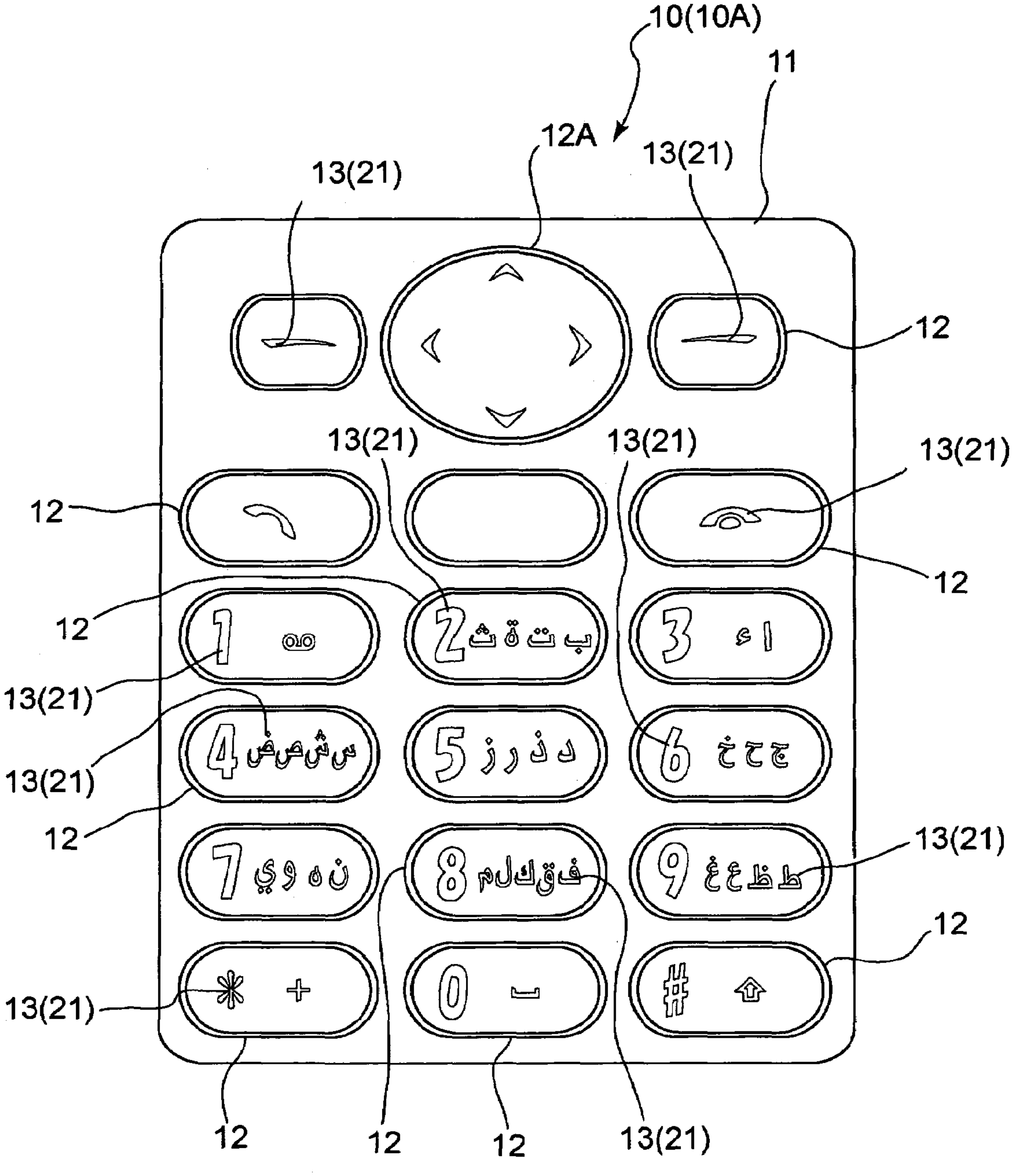
FIG. 4 is a plan view showing a key unit (after marking characters, a symbols, and so on) in the present invention.

As generally shown in FIGS. 3 and 4, the key unit 10 is made up of a key pad 11 having transparency made of a soft elastomer such as a silicone rubber or a thermoplastic elastomer; and a large number of key tops 12 disposed on the key pad 11. FIG. 3 shows the key unit 10 before marking patterns such as characters and symbols. FIG. 4 shows the key unit 10 after marking patterns (as an example, those by Arabic characters are shown) 13 such as characters and symbols. Of the key tops 12, the key top 12A disposed at the upper center and having the largest profile is used as so-called multidirection key.

Figure 6:
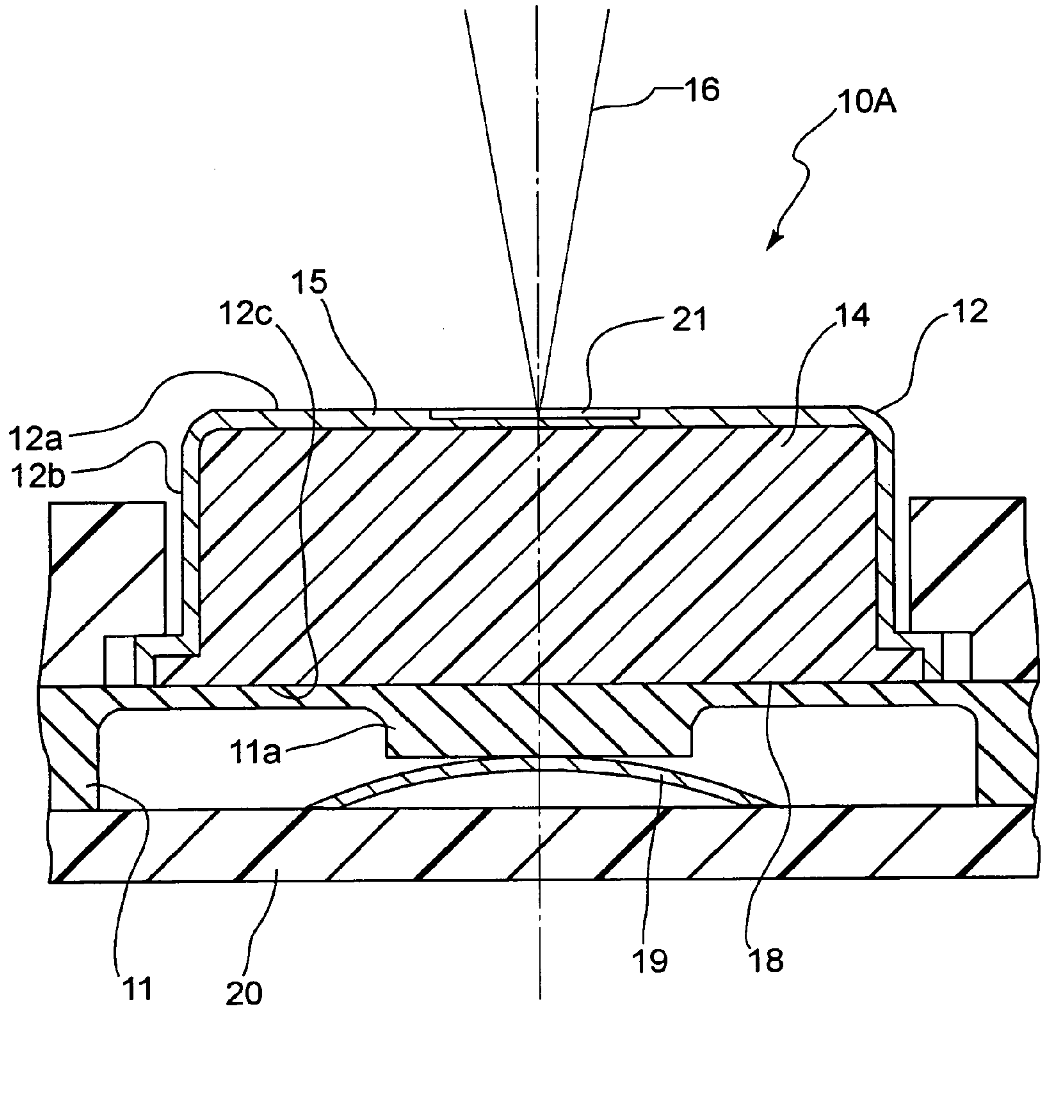
FIG. 6 is a vertical sectional view enlargedly showing a structure of a second example of a key unit.

FIG. 6 shows, in vertical section, part of the key unit 10 after marking the patterns 13 such as characters and symbols by the laser irradiation apparatus 1.

That is, in a key top 12, a 0.1 to 30 μm-thick metallic film 15 has been formed on a top face 12*a* and side faces 12*b* of a main body 14 made of a proper transparent synthetic resin by various metallic film formation means such as plating, vapor deposition, sputtering, and CVD (chemical vapor deposition method).

In case of various metallic film formation means such as sputtering, except plating, metal for generating the metallic film 15 is not particularly limited if those metallic film formation means can cope with it. In short, if various conditions such as wear resistance, corrosion resistance, and chemical resistance required for a key top for a mobile device such as a portable telephone are satisfied, then it is balance with requirement on design such as a color tone and texture.

In addition, the material of the main body 14 of the key top 12 is limited to a resin capable of plating (plating grade resin), such as ABS resin, if the metallic film 15 is formed by plating. However, if the metallic film 15 is formed by various metallic film formation means such as vapor deposition, sputtering, and CVD, except plating, various transparent resins, such as PC (polycarbonate) resin and PET (polyethylene terephthalate) resin, can be widely used.

Normally, in case that the thickness of the metallic film 15 is relatively thin by vapor deposition, sputtering, or CVD, in order to increase the wear resistance, the corrosion resistance, and so on, a not-shown overcoat by a UV (ultraviolet) setting resin paint or the like is applied on the metallic film 15. Because this overcoat is removed together with the metallic film 15 at the irradiated portion by irradiation with the laser light 16, it is desirable to be applied on the surface of the key top 12 after processing by the laser light 16.

On the metallic film 15 on the top face 12*a* of the key top 12, a pattern 13 such as a character or a symbol has been formed by completely removing the metallic film 15 at the irradiated portion by irradiation with the laser light 16 by the above laser irradiation apparatus 1 so that the surface of the main body 14 made of a synthetic resin below the metallic film 15 can be exposed and seen when the key top 13 is viewed from above. In addition, on the bottom face 12*c* of the key top 12 where no metallic film 15 exists, a colored layer 17 of a proper color has been formed by a printing method or a painting method, such as screen printing, pad printing (padding), impregnation printing, or spray painting.

The above colored layer 17 may be formed on the top face of the key top 12 immediately below the metallic film 15 (the surface of the main body 14) before formation of the metallic film 15, other than the formation on the bottom face 12*c* of the key top 12. The above colored layer 17 is unnecessary when the illuminated character is not colored. The metallic film 15 has a thickness within a range of about 1 to 30 μm though the thickness varies in accordance with the formation method. That is, in case of formation by vapor deposition, sputtering, CVD, or the like, the thickness of the metallic film 15 is relatively thin and a layer made of one kind of metal of 1 μm or less. However, in case of formation by plating, the metallic film 15 has a multilayer structure in which plating layers of, for example, a 0.2 to 1 μm-thick electroless nickel plating layer at the lowermost layer, an about 7 to 15 μm-thick electro copper plating layer at the lower layer, a 4 to 8 μm-thick nickel electro plating layer at the upper layer, and a 0.1 to 2 μm-thick plating layer of chromium, gold, or the like, at the uppermost layer. The above lower layer of electroless plating has a pinholeless structure for preventing leakage of light. Of course, there are many kinds in the structure of the plating layer and the present invention is not limited to the above structure.

In addition, in case that the metallic film 15 is formed by vapor deposition (vacuum vapor deposition or the like), a layer formed on the main body 14 of the key top 12 made of an adequate synthetic resin has a multilayer structure as follows. That is, the above multilayer structure is made up of, for example, a 10 to 20 μm-thick base (under) coat layer as the lowermost layer applied on the main body 14, the metallic film 15 of 1 μm or less formed by vapor deposition on the base coat layer, and a 10 to 20 μm-thick transparent overcoat layer applied on the metallic film 15.

In case that the metallic film 15 is formed by sputtering or CVD, like the above, a layer formed on the main body 14 of the key top 12 made of an adequate synthetic resin has a multilayer structure as follows. That is, the above multilayer structure is made up of, for example, the metallic film 15 of 1 μm or less formed by sputtering or CVD directly on the resin constituting the main body 14, and a 10 to 20 μm-thick transparent overcoat layer applied on the metallic film 15.

As described above, in case that the metallic film 15 is formed by metallic film formation means in which the film thickness is relatively thin, such as vapor deposition, sputtering, CVD, or the like, by applying an overcoat by a UV setting resin paint or the like on the metallic film 15, the wear resistance, corrosion resistance, and so on, of the metallic film 15 can be improved. In addition, by using a colored transparent paint for the overcoat, the metallic film 15 can also be colored into an arbitrary color.

The key tops 12 each having the above-described structure are fixed to the top face of the key pad 11 with a transparent adhesive 18. On one face of the key pad 11, pressing projections (pressing members) 11*a* (only one is shown) for pressing dome switches 19 (only one is shown) provided to correspond to the respective key tops 12 are integrally formed. The above dome switches 19 are disposed on a substrate 20 having an adequate circuit pattern including not-shown fixed contacts.

Figure 5:
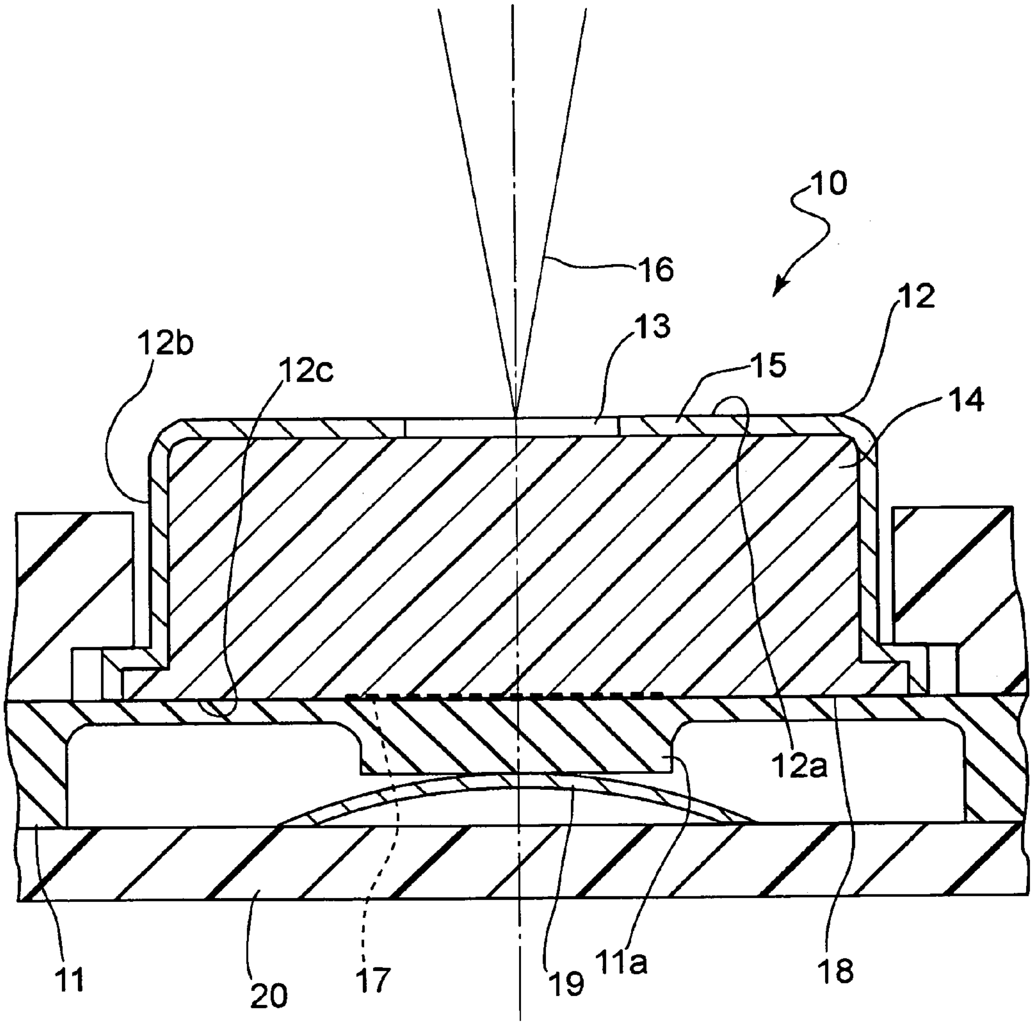
FIG. 5 is a vertical sectional view enlargedly showing a structure of a first example of a key unit.

A formation process of the pattern 13 such as a character or a symbol in case of the key unit 10 shown in FIG. 6 will be generally described as follows. That is, as shown in FIG. 1, the top face 12*a* of each key top 12 of the key unit 10 is irradiated using the above green laser as the laser light 16 applied from the laser irradiation apparatus 1. And, as shown in FIG. 5, the beam spot diameter is throttled into 10 to 30 μm on the surface of the metallic film 15, and the metallic film 15 is scanned along the plane shape of the pattern 13 such as a character or a symbol to be formed. At this time, by repeating irradiation with changing the position in a depth direction of the beam spot several times, the metallic film 15 at the irradiated portion is completely removed into the shape of the pattern 13 such as a character or a symbol to expose the main body portion 14.

As a laser other than the above-described one, a YAG laser having a wavelength of 1064 nm and the convergence diameter of 30 μm or less to the irradiated portion, a YAG laser having a wavelength of 355 nm obtained by taking out the third harmonics, or an excimer laser having a wavelength of 180 nm and the convergence diameter at molecular level to the irradiated portion, can be also used.

Therefore, in case that the above key unit 10 is incorporated in a portable telephone, upon use, a light from a not-shown light source permeates the key pad 11 having transparency, enters the bottom face of a key top 12 through the colored layer 17, and outgoes from the pattern 13 such as a character or a symbol to the outside. Thus, a user of the portable telephone can easily recognize the character, the symbol, or the like, on the key top 12. When the key top 12 is pressed downward, because the key pad 11 is deformed attendant upon the downward movement of the key top 12, the dome switch 19 is pressed by the pressing projection 11*a* to be deformed, and thereby conduction is made between not-shown fixed contacts on the substrate 20.

On the other hand, on the irradiated portion of the key top 12 with the laser light 16, not the metallic film 15 is completely removed but only a surface layer portion of the metallic film at the irradiated portion may be removed to form a plane aggregation of a large number of very small recessed points, that is, a so-called Shibo process may be performed. Because the above Shibo process is a process of removing only a surface layer portion of the metallic film 15, in case that the metallic film 15 is formed by metallic film formation means in which the film thickness is relatively thin (the thickness is about 1 μm or less), such as vapor deposition, sputtering, or CVD, the Shibo process can not cope with it because the thickness is too thin. Therefore, as the metallic film 15 in this case, a metallic layer whose thickness is relatively thick (the thickness is 3 to 30 μm) by plating or the like is objective.

FIG. 6 shows, in vertical section, part of a second example 10A of a key unit on which marking has been applied by a Shibo process with a laser light. In this second example, each part structurally the same as that of the key unit 10 in the above first example 1 is denoted by the same reference numeral as that used in the first example, and thereby the description thereof is omitted.

As shown in FIG. 6, a formation process of a pattern 21 such as a character or a symbol in case of the key unit 10A will be generally described as follows. As shown in FIG. 1, the top face 12*a* of each key top 12 of the key unit 10A is irradiated using the above green laser as the laser light 16 applied from the laser irradiation apparatus 1. And, as shown in FIG. 6, the beam spot diameter is throttled into 10 to 30 μm on the surface of the metallic film 15, and the metallic film 15 is scanned along the plane shape of the pattern 13 such as a character or a symbol to be formed. At this time, by irradiating with fixing the position in a depth direction of the beam spot, only a surface layer portion of the metallic film 15 is removed to form a recess, and by forming a plane aggregation of a large number of very small recessed points on the bottom face, a pattern 21 such as a character or a symbol is formed. In this case, in case that the metallic film 15 has been formed by plating or the like, because the thickness of the metallic film 15 is 10 to 30 μm, each very small recess point constituting the pattern 21 such as a character or a symbol is desirably 20 μm or less at the maximum.

As for the above pattern 20 such as a character or a symbol, there are a method in which the outline of the character, the symbol, or the like, is subjected to the Shibo process without any change, and a method in which a recess is formed by the Shibo process outside the outline of the character, the symbol, or the like, to surround the outline of the character, the symbol, or the like. In addition, if the thickness of the metallic film 15 on the bottom face of the pattern 21 such as a character or a symbol is processed thinly to the degree of having a metallic feeling without losing the transparency, the light from the light source having entered from the bottom face 12*c* of the key top 12 can outgo from the pattern 21 such as a character or a symbol, and the character, the symbol, or the like, can be a illumination type. In this case, like the above-described key unit 10, if a colored layer 17 is provided on the bottom face 12*c* of the key top 12, or the like, the character, the symbol, or the like, can also be illuminated in an arbitrary color.

Next, a manufacturing method of the key unit 10 or 10A of the present invention will be described.

Figure 7:
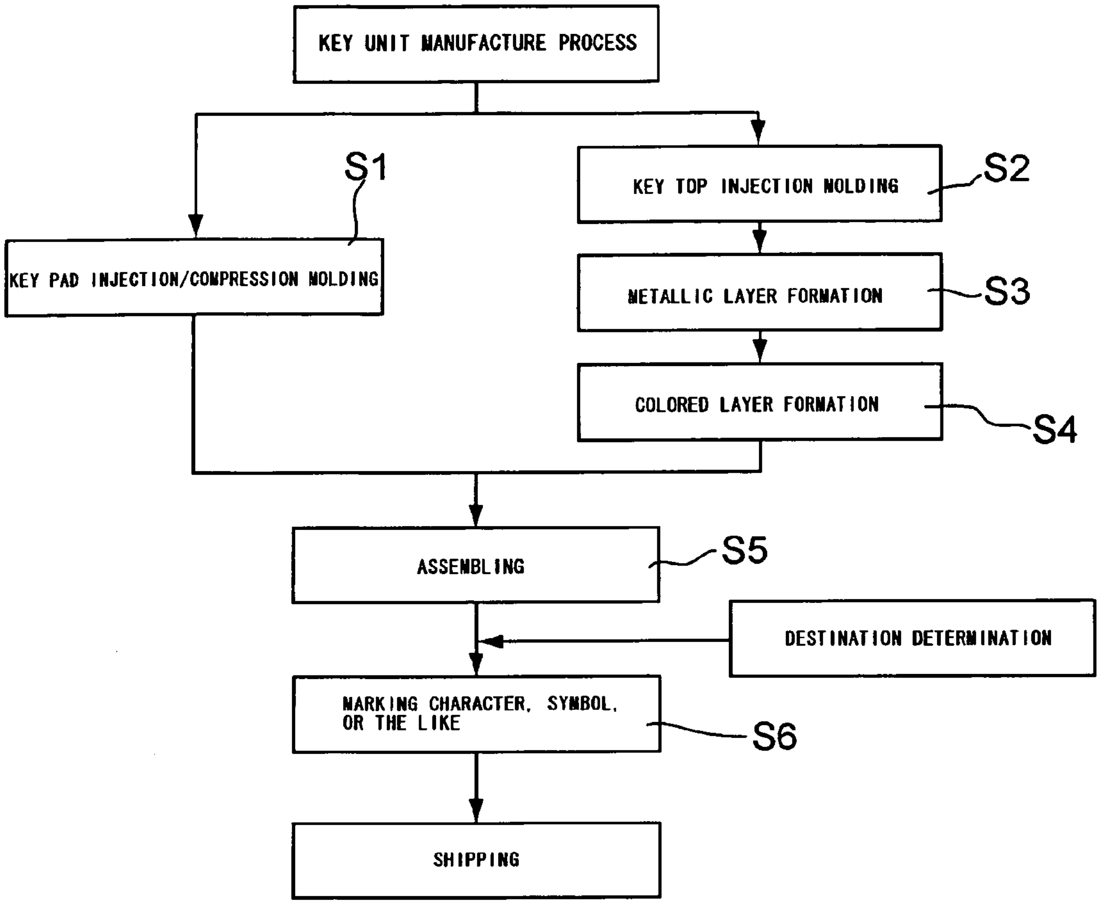
FIG. 7 is a block diagram showing a flow of a manufacturing process in a manufacturing method of a key unit of the present invention.
Figure 8:
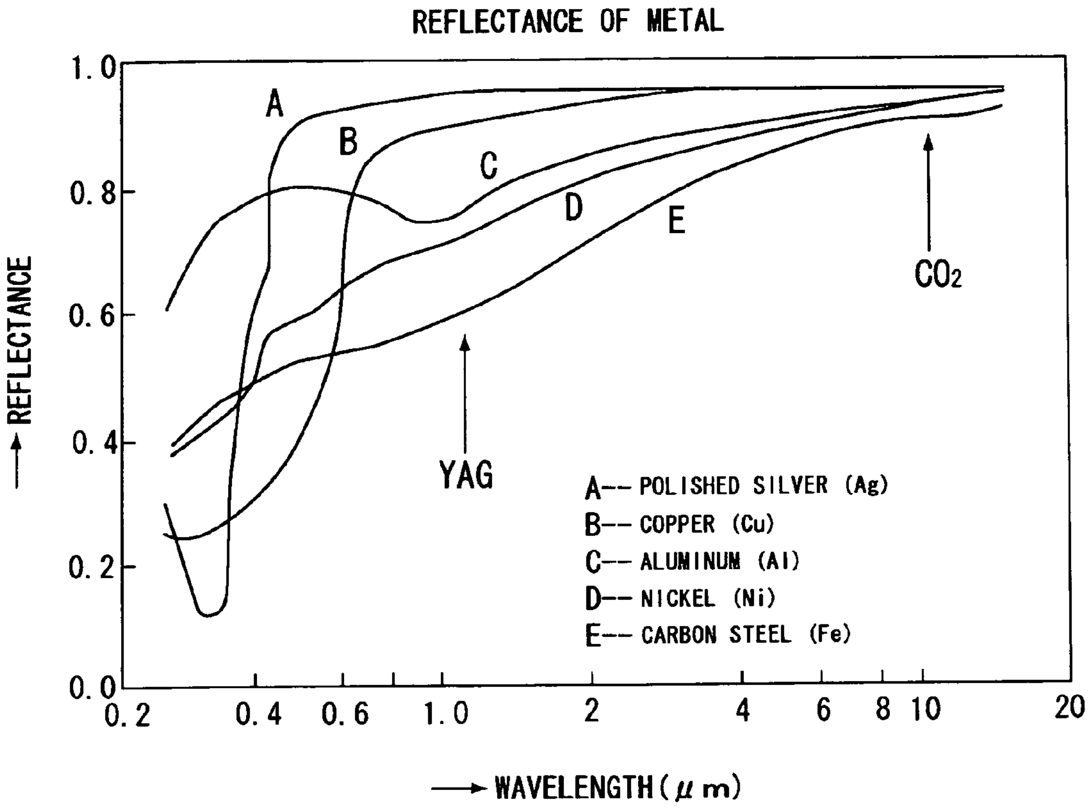
FIG. 8 is a graph showing changes in resistances of various kinds of plated surfaces (axis of ordinates) to the wavelength of a laser light (axis of abscissas).

That is, as shown in FIG. 7, the key pad 11 and the key tops 12 are formed separately by an adequate molding method such as injection molding (Step S1 and Step S2); further, the metallic film 15 is formed on the top faces 12*a* and the side faces 12*b* of the key tops 12 by various metallic film formation means such as plating, vapor deposition, sputtering, and CVD (formation only by plating in case of the key unit 10A) (Step S3); and further, if need, the colored layer 17 is formed on the bottom face 12*c* of the key top 12 (Step S4). And, finally, the key tops 12 are bonded using the transparent adhesive 18 or the like (Step S5). In case that the key top 12 having the metallic film 15 and key tops in each of which a pattern such as a character and a symbol is to be marked on a layer on the surface by printing or painting are mixed in the key unit 10 or 10A, those key tops not having the metallic films 15 do not pass through the above Step S3 and printing or painting on the surface is performed in Step S4.

When a destination of the key unit 10 or 10A is determined and characters, symbols, or the like, dependent upon the use language are decided, marking a character, a symbol, or the like, to each key top of the key unit 10 or 10A is performed using the laser irradiation apparatus 1 (Step S6). After completion of this marking step to the key tops 12, the key unit 10 or 10A is shipped solely or with being incorporated in a predetermined mobile device.

In the above first example 10 and second example 10A of the key unit, it has been described that any of the key tops 12 has the metallic film 15, and all characters, symbols, and the like, on those key tops 12 are formed by marking the metallic films 15 with the laser light. However, the present invention is not limited to that. The pattern 13 or 20 such as a character or a symbol may be formed on at least one key top 12 by the above marking method.

In addition, because the above pattern 13 or 20 such as a character or a symbol differ only in control method of the position of the beam spot in a depth direction of the metallic film 15 on the key top 12 upon irradiation with the laser light, both can be properly mixed on one key unit. Further, not all the key tops 12 have the metallic films 15 but the key top 12 having the metallic film 15 and a key top not having the metallic film 15 may be mixed. In case that the key tops different in structure are thus mixed, marking all the patterns such as characters and symbols is desirably unified into one by the laser light using the laser irradiation apparatus 1.

What is claimed is:

1. A key unit used in a mobile device such as a portable telephone in which a large number of key tops are disposed on a key pad having a substantially sheet shape made of a silicone rubber or a soft thermoplastic elastomer, characterized in that at least one of the key tops has a structure in which a top face or a side face except a bottom face of a main body made of a transparent hard resin is covered with a metallic film formed by plating, and a pattern of a character or a symbol is formed by irradiating the key top with a laser light, and then removing a surface portion only of the metallic film at an irradiated portion to constitute a plane aggregation of a large number of very small recessed points.

2. The key unit according to claim 1, characterized in that as the laser light, there is used one of a laser light having a wavelength of 532 nm obtained by taking out a second harmonic of Nd:YAG laser, a laser light having a wavelength of 355 nm obtained by taking out a third harmonic of the laser, a laser light of a YAG laser having a wavelength of 1064 nm and a convergence diameter of 30 μm or less to the irradiated portion, and an excimer laser light having a wavelength of 180 nm and a convergence diameter at molecular level.

3. A marking method for forming a predetermined pattern on a key top which comprises irradiating, with a laser light, a metallic film formed by plating on a key top surface in a key unit used in a mobile device such as a portable telephone in which a large number of key tops are disposed on a key pad having a substantially sheet shape, said keypad being made of a silicone rubber or a soft thermoplastic elastomer, removing a surface portion only of the metallic film at an irradiated portion and to constituted by an aggregation of a large number of very small recessed points, thereby forming a paftern of a character, a symbol or the like, characterized in that the laser light has a wavelength of 1100 nm or less.

4. A marking method for forming a predetermined pattern on a key top according to claim 3, characterized in that as the laser light, there is used a laser light having a wavelength of 532 nm which is obtained by taking out a second harmonics of Nd:YAG laser, a laser light having a wavelength of 355 nm which is obtained by taking out a third harmonic of the laser, a laser light of a YAG laser having a wavelength of 1064 nm and a convergence diameter of 10 to 30 μm or less to the irradiated portion, and an excimer laser light having a wavelength of 180 nm and a convergence diameter at molecular level.

5. A method manufacturing of a key unit used in a mobile device such as a portable telephone in which a large number of key tops are disposed on a key pad having substantially sheet shape, characterized in that unmarked key tops including a key top having a metallic film are combined with a key unit; temporarily stopping manufacturing at a point in the process wherein all other steps except marking of the key tops has been completed; maintaining the temporary stopping in manufacturing until a content of a character, or a symbol necessary for the product are decided; and then marking the character or a symbol by marking said key tops by a process comprising irradiating, with a laser light, a metallic film formed by plating on a key top surface in a key unit used in a mobile device such as a portable telephone in which a large number of key tops are disposed on a key pad having a substantially sheet shape, said key tops being made of a silicone rubber or a soft thermoplastic elastomer, removing a surface portion only of the metallic film at an irradiated portion constituted by an aggregation of a large number of very small recessed points, thereby forming a pattern of a character or a symbol, by laser light having a wavelength of 1100 nm or less by using a laser light having a wavelength of 532 nm which is obtained by taking out a second harmonic of Nd:YAG laser, a laser light having a wavelength of 355 nm which is obtained by taking out a third harmonic of the laser, a laser light of a YAG laser having a wavelength of 1064 nm and a convergence diameter of 10 to 30 μm or less to the irradiated portion, and an excimer laser light having a wavelength of 180 nm and a convergence diameter at molecular level.

* * * * *